United States Patent
Ominami et al.

(10) Patent No.: US 10,431,416 B2
(45) Date of Patent: Oct. 1, 2019

(54) OBSERVATION SUPPORT UNIT FOR CHARGED PARTICLE MICROSCOPE AND SAMPLE OBSERVATION METHOD USING SAME

(71) Applicant: HITACHI HIGH-TECHNOLOGIES CORPORATION, Minato-ku, Tokyo (JP)

(72) Inventors: Yusuke Ominami, Tokyo (JP); Akiko Hisada, Tokyo (JP)

(73) Assignee: HITACHI HIGH-TECHNOLOGIES CORPORATION, Tokyo (JP)

(*) Notice: Subject to any disclaimer, the term of this patent is extended or adjusted under 35 U.S.C. 154(b) by 0 days.

(21) Appl. No.: 15/753,685

(22) PCT Filed: Aug. 21, 2015

(86) PCT No.: PCT/JP2015/073453
§ 371 (c)(1),
(2) Date: Feb. 20, 2018

(87) PCT Pub. No.: WO2017/033219
PCT Pub. Date: Mar. 2, 2017

(65) Prior Publication Data
US 2019/0013177 A1  Jan. 10, 2019

(51) Int. Cl.
*H01J 37/16* (2006.01)
*H01J 37/20* (2006.01)
(Continued)

(52) U.S. Cl.
CPC .............. *H01J 37/16* (2013.01); *H01J 37/20* (2013.01); *H01J 37/244* (2013.01); *H01J 37/28* (2013.01);
(Continued)

(58) Field of Classification Search
CPC .............. H01J 37/20; H01J 2237/2003; H01J 2237/2002; H01J 2237/2004; H01J 2237/166; G01N 23/2204; G01N 2223/418
(Continued)

(56) References Cited

U.S. PATENT DOCUMENTS 8,604,429 B2 * 12/2013 Yaguchi .................. H01J 37/20
250/306
9,472,375 B2 * 10/2016 Ominami ................ H01J 37/16
(Continued)

FOREIGN PATENT DOCUMENTS

CN     103329240 A     9/2013
CN     104851769 A     8/2015
(Continued)

OTHER PUBLICATIONS

Korean Office Action dated Dec. 19, 2018 for KR Application No. 10-2018-7002734 (with machine translation).
(Continued)

*Primary Examiner* — David A Vanore
(74) *Attorney, Agent, or Firm* — Miles & Stockbridge PC

(57) ABSTRACT

In order to observe a water-containing sample with excellent convenience under an air atmosphere or a gas atmosphere, or under a desired pressure, in the present invention, there is provided an observation support unit for observation by irradiating the sample disposed in a non-vacuum space separated by a diaphragm from an inner space of a charged particle optical lens barrel that generates a charged particle beam, with the charged particle beam. The observation support unit includes a main body portion for covering a hole portion that forms an observation region where the sample is observed, and the sample, and the observation
(Continued)

support unit is directly mounted between the sample and the diaphragm, that is, on the sample.

21 Claims, 12 Drawing Sheets

(51) Int. Cl.
*H01J 37/28* (2006.01)
*H01J 37/244* (2006.01)

(52) U.S. Cl.
CPC .......... *H01J 2237/1825* (2013.01); *H01J 2237/2003* (2013.01); *H01J 2237/2007* (2013.01)

(58) Field of Classification Search
USPC .............. 250/307, 310, 440.11, 306, 442.11, 250/453.11
See application file for complete search history.

(56) References Cited

U.S. PATENT DOCUMENTS

| | | | |
|---|---|---|---|
| 9,633,817 B2* | 4/2017 | Kawanishi | H01J 37/18 |
| 10,068,745 B2* | 9/2018 | Yaguchi | H01J 37/16 |
| 2009/0242763 A1 | 10/2009 | Buijsse | |
| 2011/0284745 A1* | 11/2011 | Nishiyama | G01N 23/2204 250/307 |
| 2011/0303845 A1 | 12/2011 | Yaguchi et al. | |
| 2013/0313430 A1 | 11/2013 | Ominami et al. | |
| 2014/0021347 A1 | 1/2014 | Ominami et al. | |
| 2014/0175278 A1 | 6/2014 | Ominami et al. | |
| 2015/0213999 A1* | 7/2015 | Ominami | H01J 37/16 250/310 |
| 2015/0255244 A1* | 9/2015 | Ominami | H01J 37/16 250/307 |
| 2015/0311033 A1* | 10/2015 | Ominami | H01J 37/16 250/307 |
| 2016/0025659 A1* | 1/2016 | Ominami | H01J 37/20 250/307 |
| 2016/0189919 A1* | 6/2016 | Passmore | H01J 37/20 250/307 |
| 2016/0217971 A1 | 7/2016 | Yaguchi et al. | |
| 2016/0329188 A1* | 11/2016 | Ominami | H01J 37/244 |
| 2016/0336145 A1* | 11/2016 | Ominami | H01J 37/28 |
| 2017/0330724 A1* | 11/2017 | Okumura | H01J 37/20 |
| 2018/0122617 A1* | 5/2018 | Kawanishi | H01J 37/16 |

FOREIGN PATENT DOCUMENTS

| | | |
|---|---|---|
| JP | 2009-245944 A | 10/2009 |
| JP | 2010-192126 A | 9/2010 |
| JP | 2012-221766 A | 11/2012 |
| JP | 2014-103014 | 6/2014 |
| WO | WO 2010/092747 A1 | 8/2010 |
| WO | WO 2014/141744 A1 | 9/2014 |
| WO | WO 2015/053020 A1 | 4/2015 |

OTHER PUBLICATIONS

Chinese Office Action dated Jan. 4, 2019 for CN Application No. 201580082455.5.

Japanese Office Action dated Sep. 25, 2018 for Application No. 2017-536064.

\* cited by examiner

[Fig. 1]
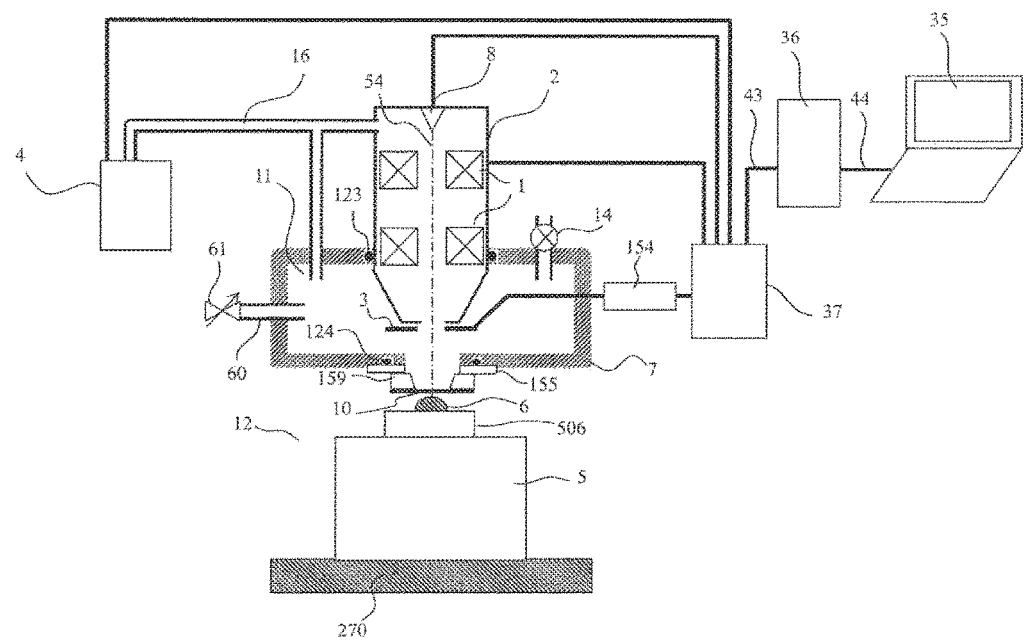

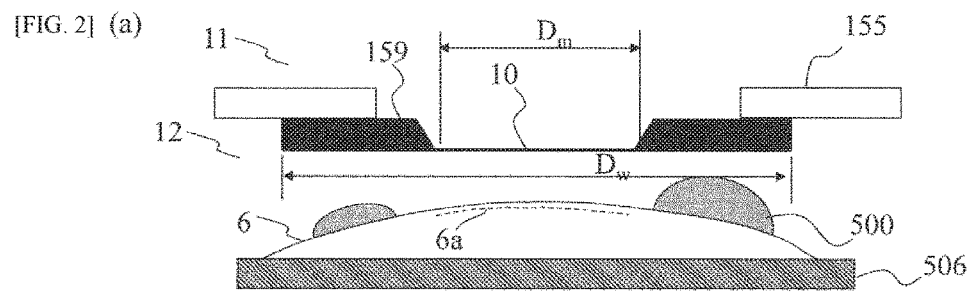
[FIG. 2] (a)
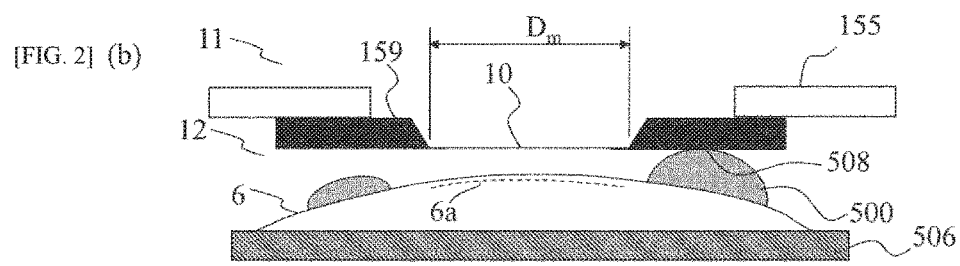
[FIG. 2] (b)
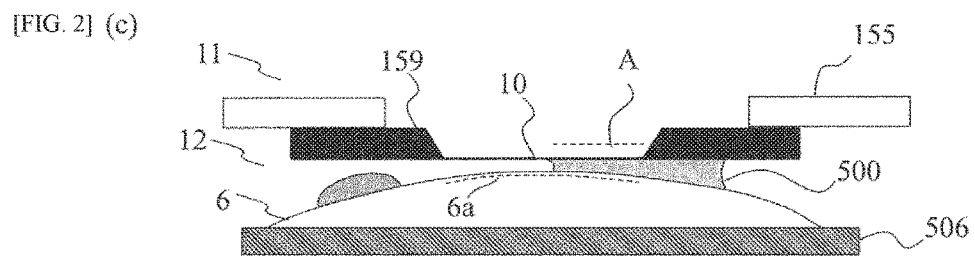
[FIG. 2] (c)
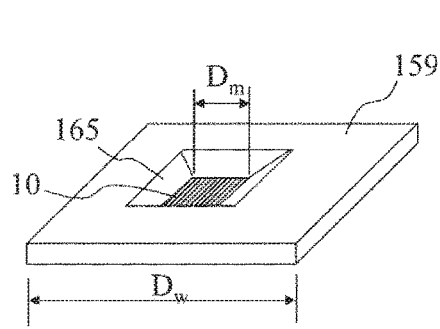
[FIG. 3] (a)
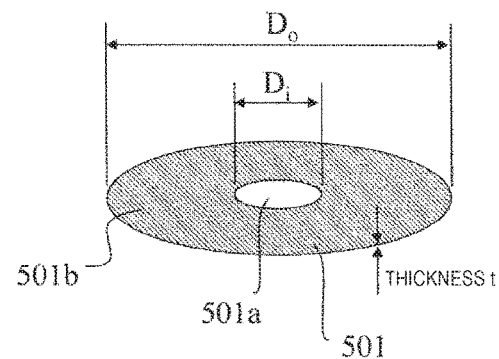
[FIG. 3] (b)

[FIG. 4] (a)
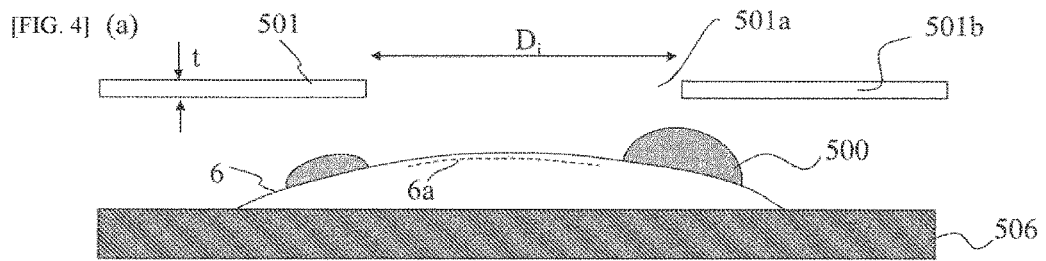
[FIG. 4] (b)
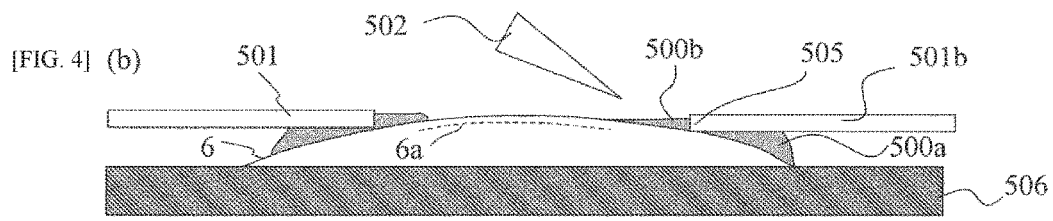
[FIG. 4] (c)
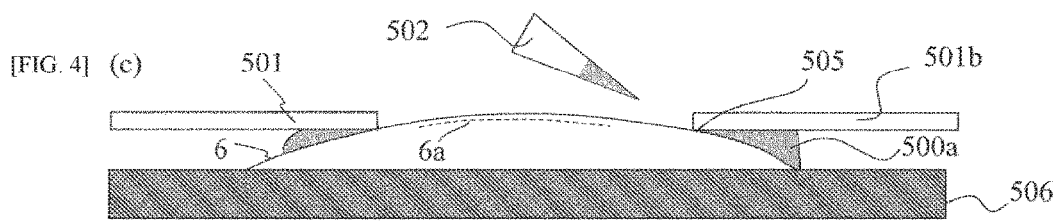
[FIG. 5] (a)
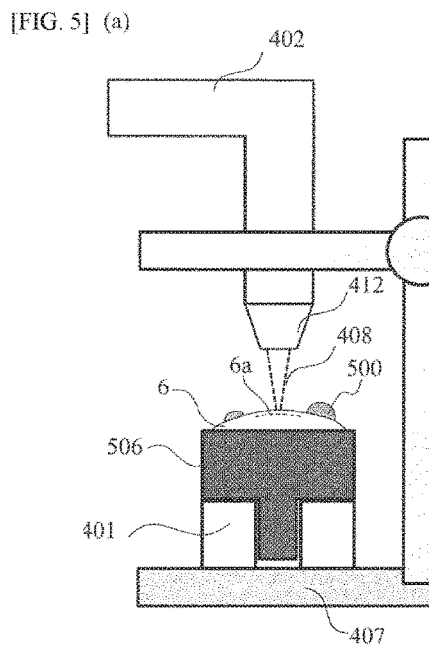
[FIG. 5] (b)
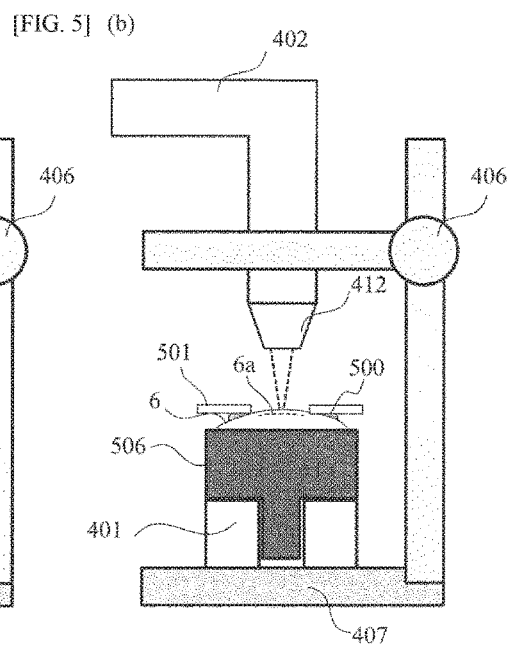

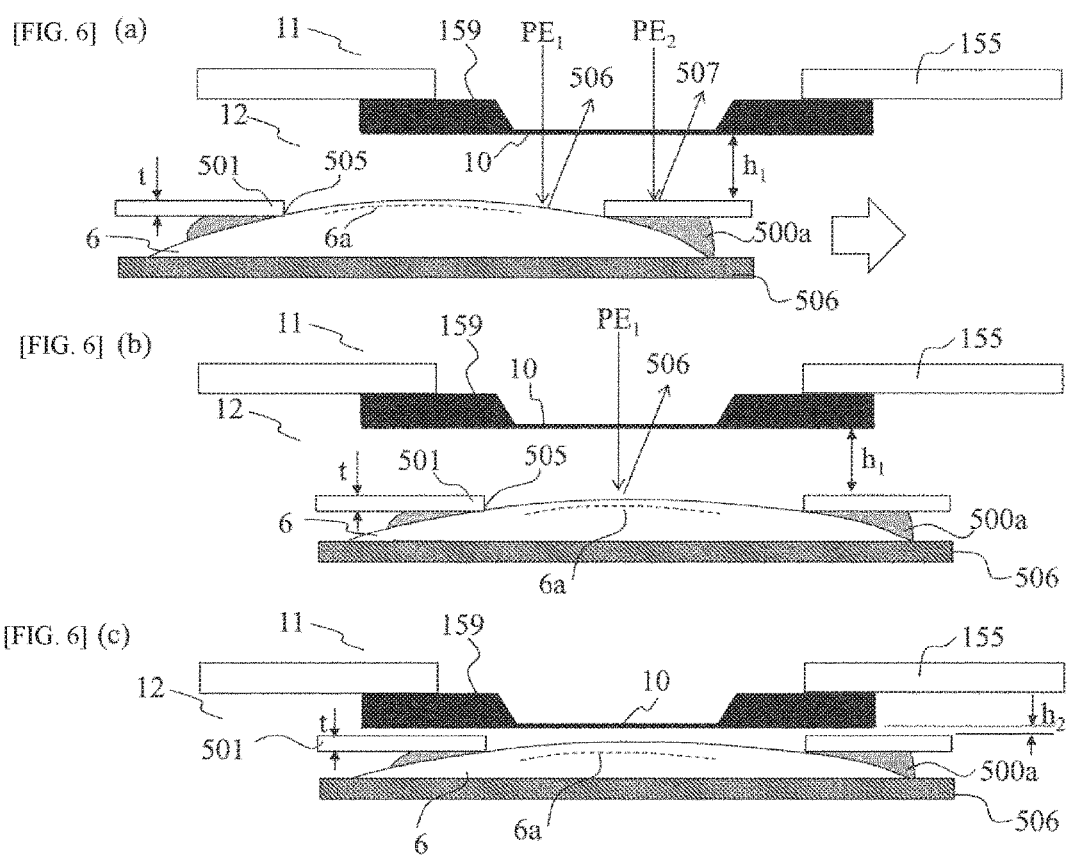

[Fig. 7]
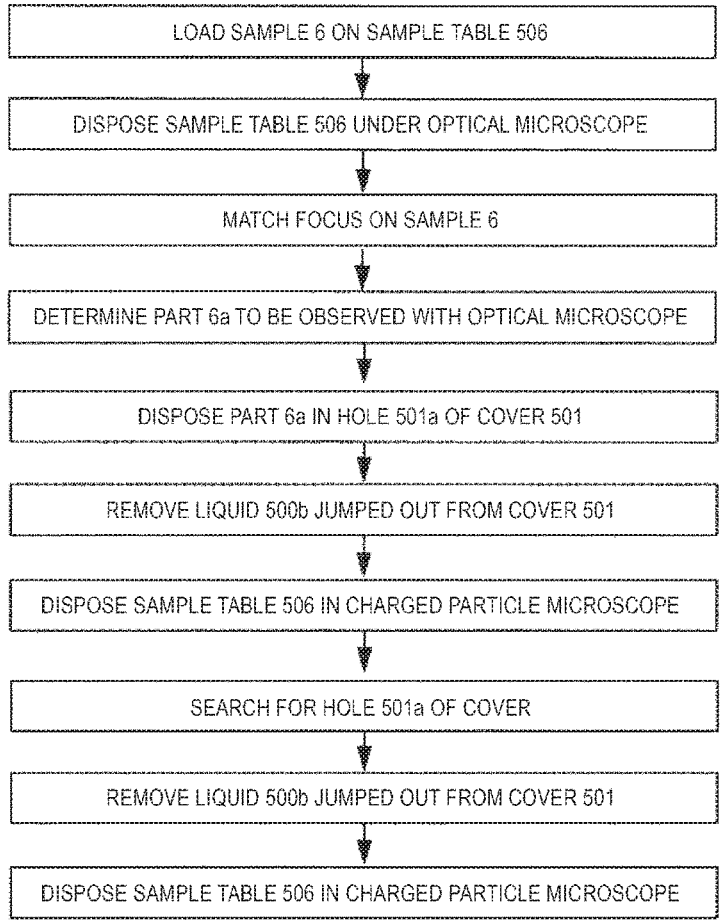
[Fig. 8]
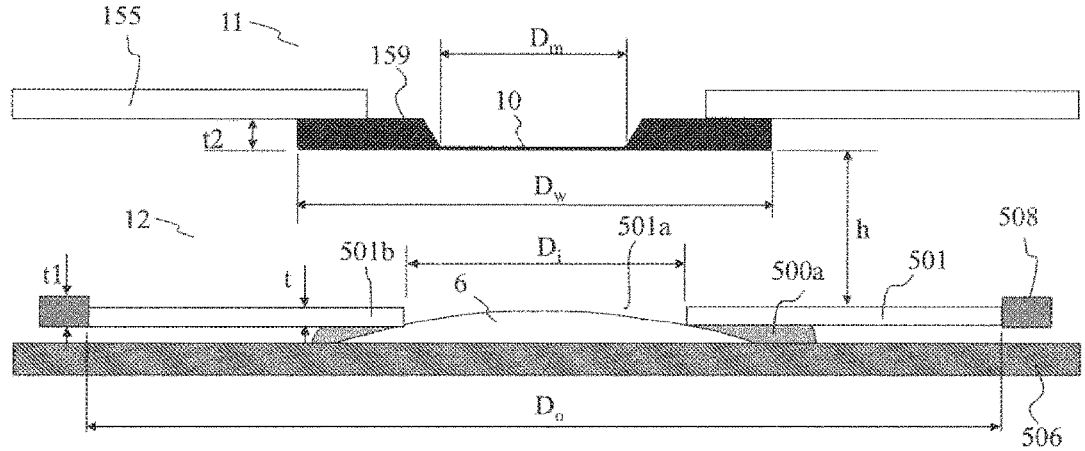

[Fig. 9]
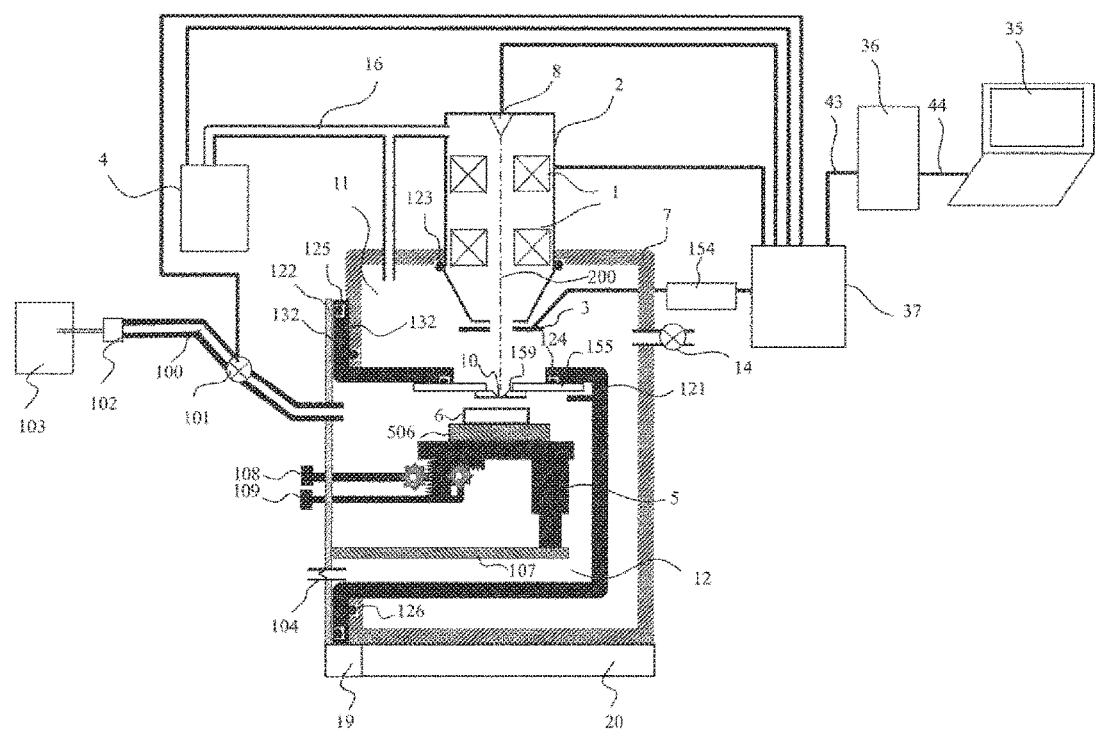

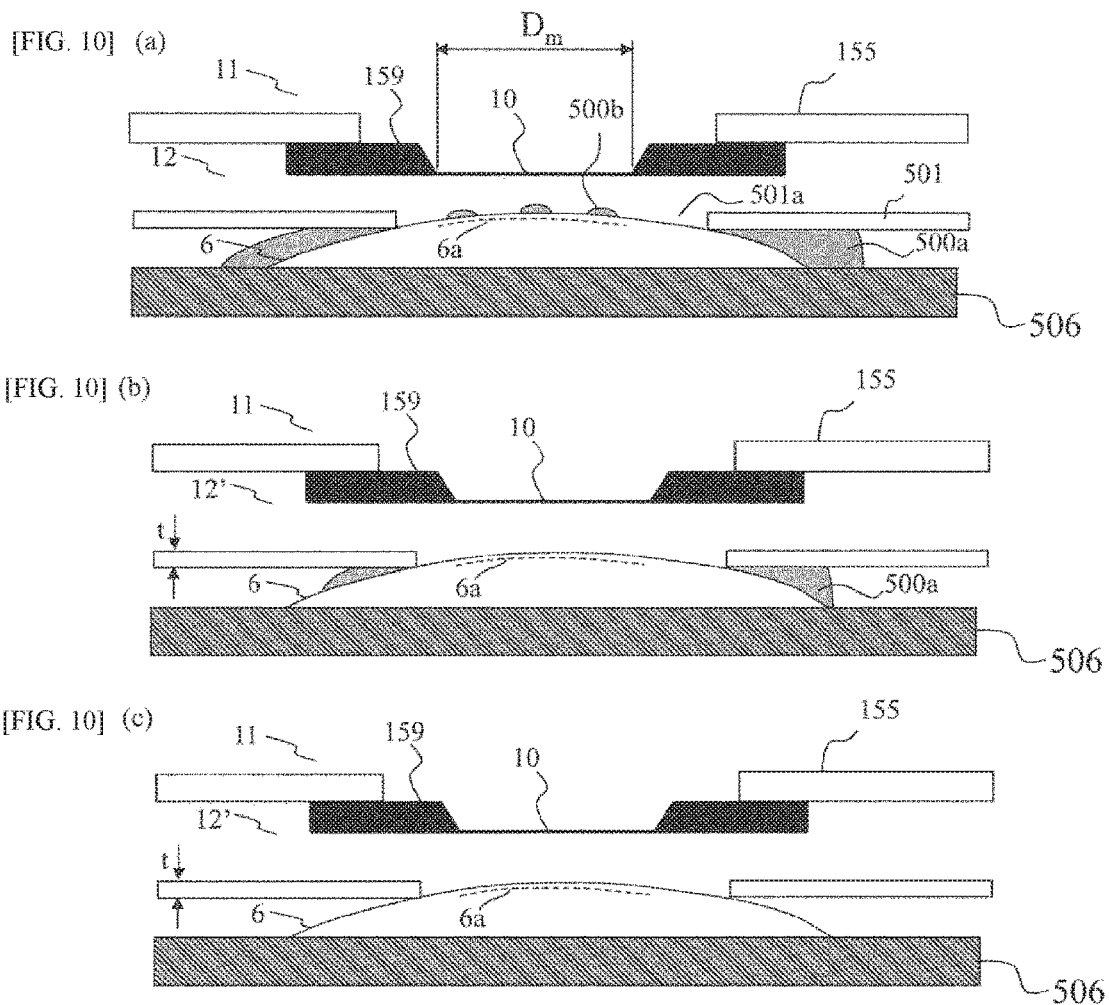

[Fig. 11]
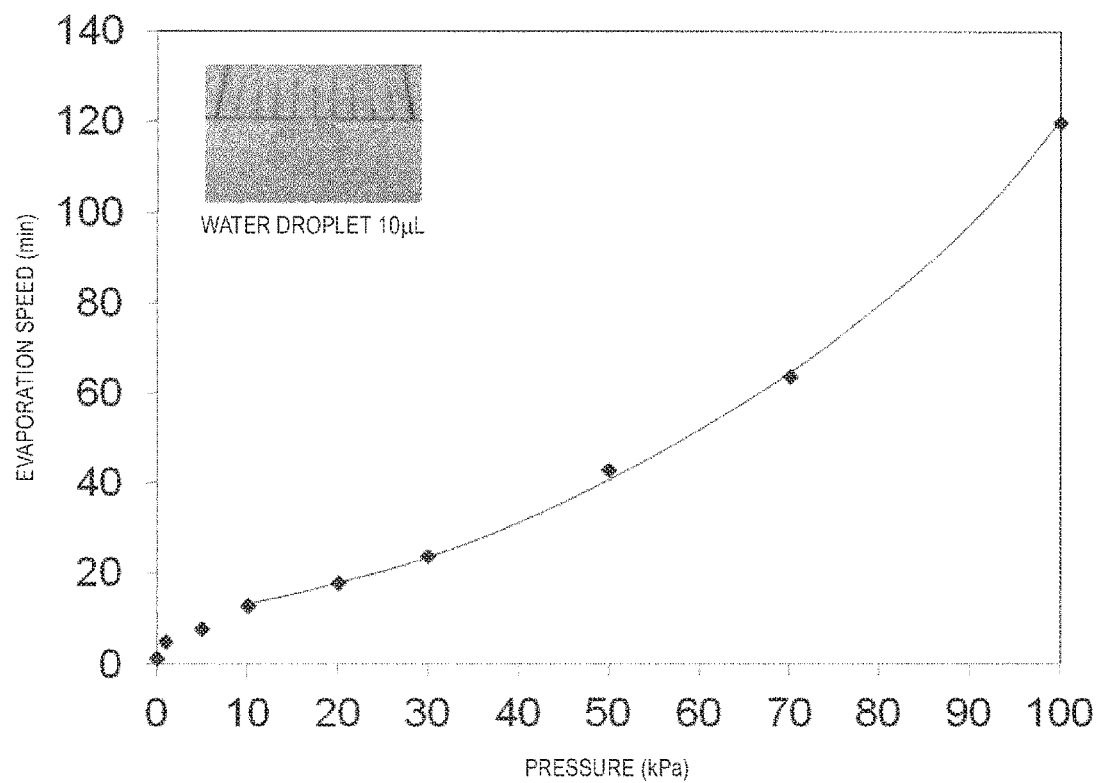

[FIG. 12] (a)
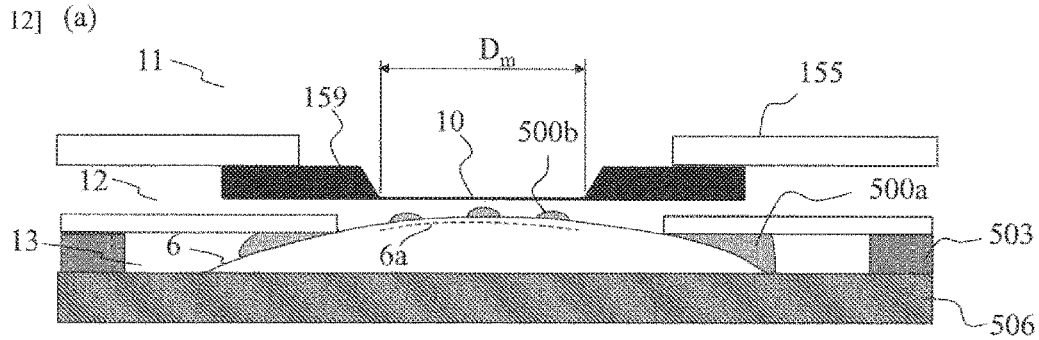
[FIG. 12] (b)
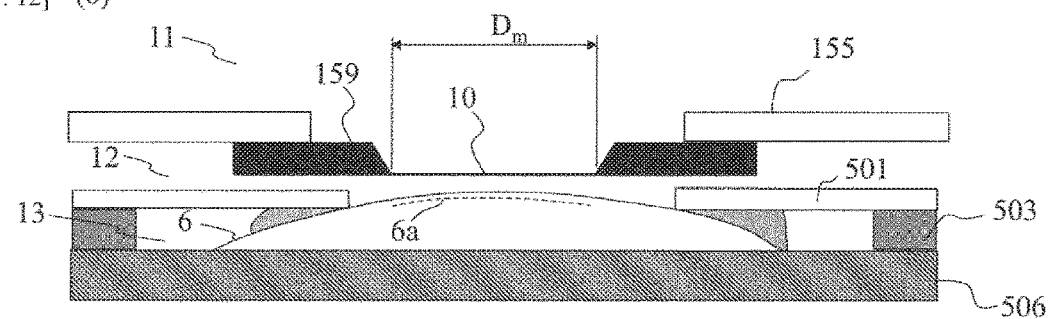

[Fig. 13]
(a)
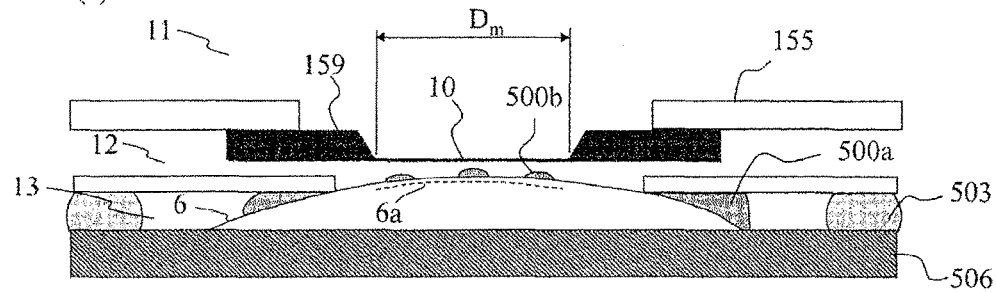
(b)
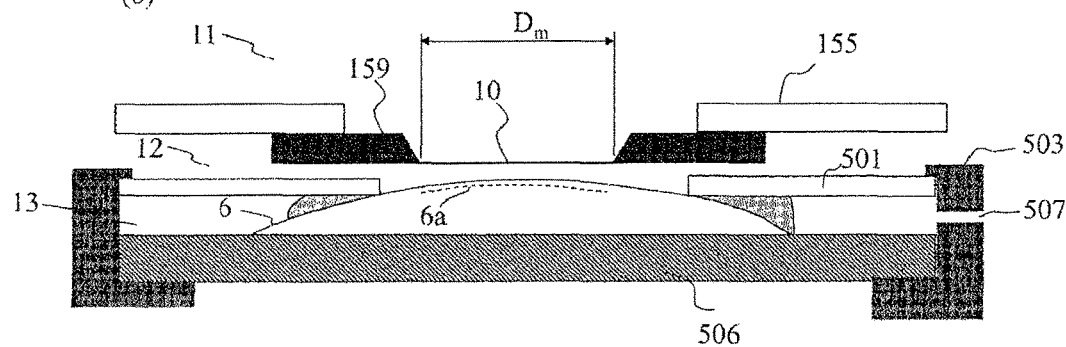
[Fig. 14]
(a)
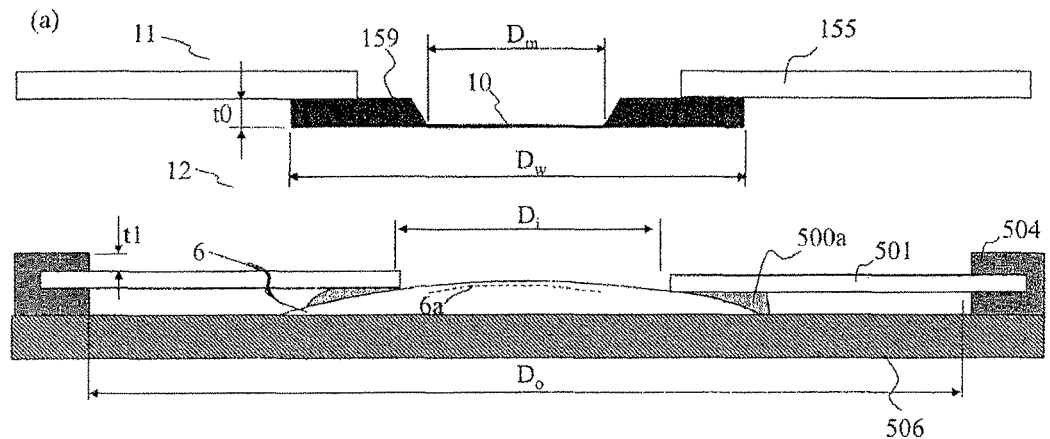
(b)
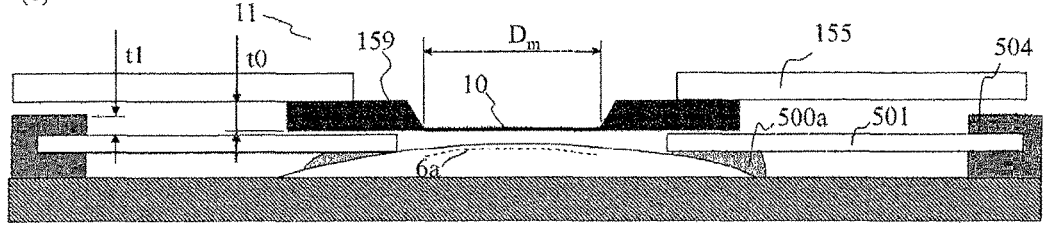

[FIG. 15] (a)
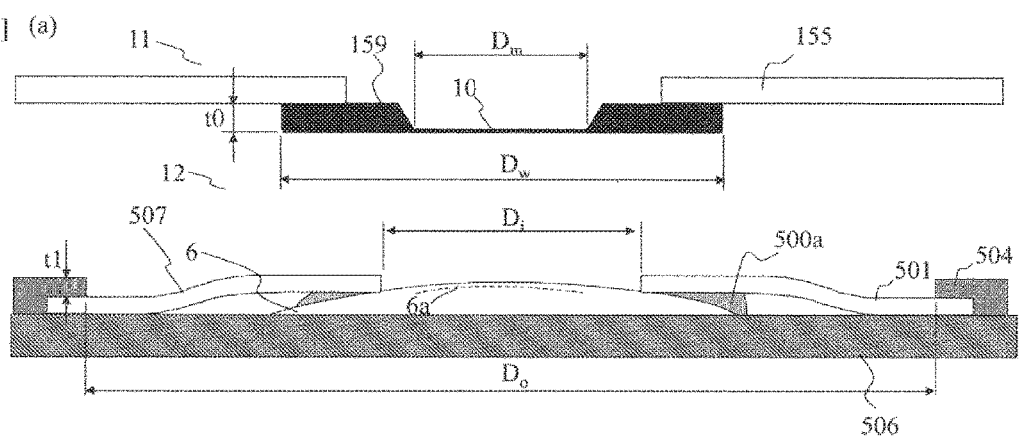
[FIG. 15] (b)
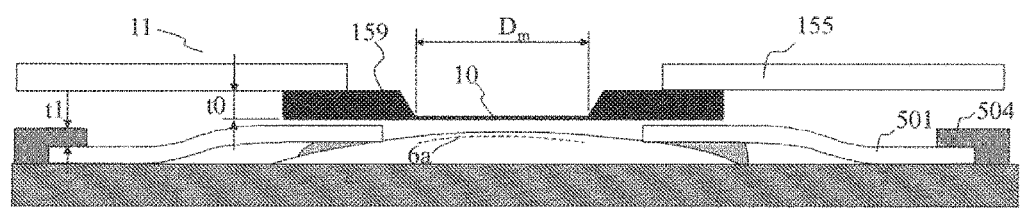

[Fig. 16]
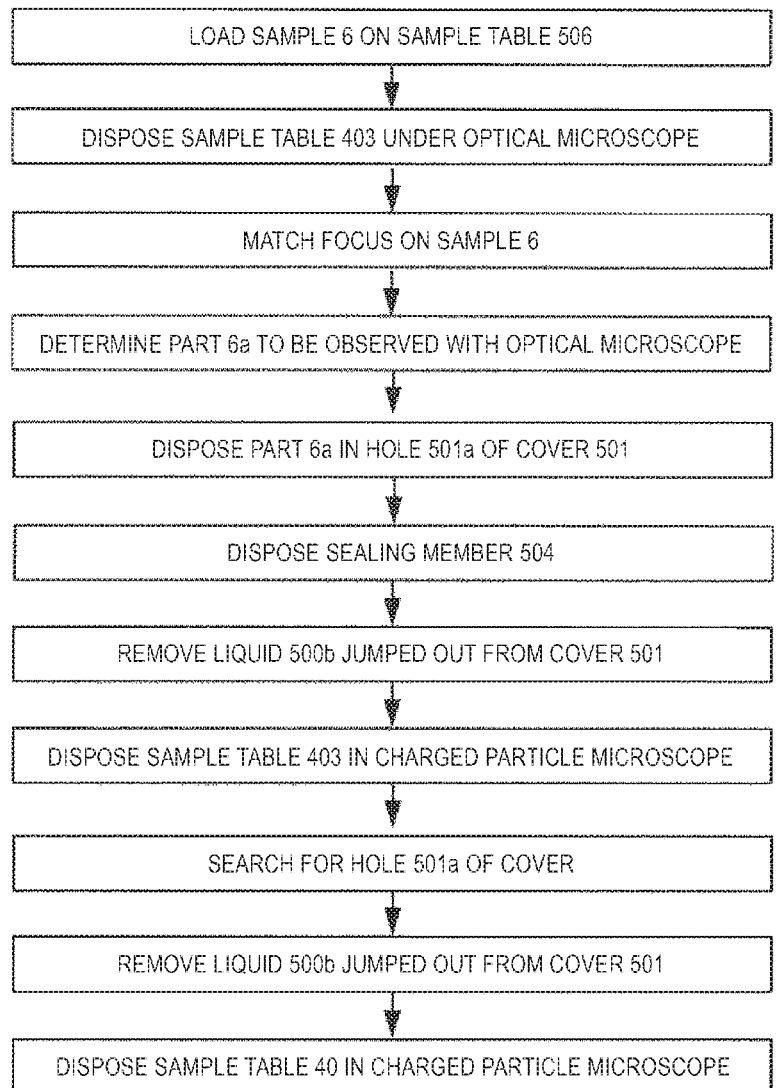

OBSERVATION SUPPORT UNIT FOR CHARGED PARTICLE MICROSCOPE AND SAMPLE OBSERVATION METHOD USING SAME

TECHNICAL FIELD

The present invention relates to a charged particle beam apparatus which is capable of observing a sample under an atmospheric pressure, or under a desired gas pressure or type of gas, and an observation support unit for the charged particle beam apparatus.

BACKGROUND ART

In order to observe a minute region of an object, a scanning electron microscope (SEM), a transmission electron microscope (TEM), or the like is used. In general, in these apparatuses, a housing for disposing the sample is evacuated and the sample is captured by evacuating the sample atmosphere to make the atmosphere to a vacuum state. However, in a case where a water-containing sample, such as a biological sample or a liquid sample, is damaged or the state thereof changes due to the vacuum state. Meanwhile, since there are substantial needs for observing such a sample using an electron microscope, an SEM apparatus which is capable of observing an observation target sample under the atmospheric pressure, or under the desired gas pressure or type of gas, is strongly desired.

In recent years, an SEM apparatus which is capable of disposing the sample under the atmospheric pressure, or under the desired gas pressure or type of gas, by providing a diaphragm or a minute hole through which an electron beam can transmit between an electron optical system and the sample, and by partitioning the state into the vacuum state in which the electron beam flies and the state under the sample atmosphere, is known. In PTL 1, a case where a sample under the atmosphere is SEM-observed in a state where a diaphragm and a sample are not in contact with each other using a sample stage disposed immediately under the diaphragm, and a position of the sample for the observation is adjusted, is disclosed.

CITATION LIST

Patent Literature

PTL 1: JP-A-2012-221766 (US-A-2014/0021347)

SUMMARY OF INVENTION

Technical Problem

In the charged particle beam apparatus described in PTL 1, it is necessary to adjust the distance between the diaphragm and the sample to be extremely small for the observation, but in a case where an observation object is a water-containing sample, there is a case where water droplets which exist on a sample surface enter between the diaphragm and the sample and the sample observation becomes difficult. In particular, even in a state where there are no water droplets at a part to be observed or immediately below the diaphragm, when the sample is brought close to the diaphragm, the water droplets are brought into contact with a member which holds the diaphragm, and thus, there is a problem that liquid droplets move to the diaphragm side.

Therefore, it is difficult to observe the water-containing sample in the apparatus of the related art.

The present invention has been made considering such problems, and an object thereof is to provide a sample observation method which can observe more easily a water-containing sample under an air atmosphere or a gas atmosphere, or under a desired pressure, and an observation support unit used in the sample observation method.

Solution to Problem

In order to solve the above-described problem, there is provided an observation support unit for observation by irradiating a sample disposed in a non-vacuum space separated by a diaphragm from an inner space of a charged particle optical lens barrel that generates a charged particle beam, with the charged particle beam. The observation support unit includes a main body portion for covering a hole portion that forms an observation region where the sample is observed, and the sample. In addition, the observation support unit is directly mounted between the sample and the diaphragm, that is, on the sample.

In addition, as a sample observation method which uses the observation support unit, there is provided a sample observation method including: a step of directly loading an observation support unit on a sample; and a step of bringing the sample on which the observation support unit is loaded close to the diaphragm.

Advantageous Effects of Invention

According to the present invention, by disposing a cover which serves as the observation support unit between the diaphragm and the sample, it is possible to substantially reduce a probability that extra liquid droplets come into contact with the diaphragm. As a result, it is possible to clearly obtain an image of a water-containing sample with convenience. In addition, since the probability that the liquid droplets come into contact with the diaphragm is substantially reduced, the frequency of replacement of the diaphragm can be reduced and the running costs can be suppressed.

The problems, configurations, and effects other than those described above will be clarified from the description of the following embodiments.

BRIEF DESCRIPTION OF DRAWINGS

FIG. 1 is an overall configuration view of a charged particle microscope according to Example 1.

FIGS. 2(a) to 2(c) are views illustrating a diaphragm and the vicinity of a water-containing sample in a case where a cover is not used.

FIGS. 3(a) to 3(b) are views illustrating the diaphragm and the cover in Example 1.

FIGS. 4(a) to 4(c) are views illustrating the vicinity of the sample in the case where the cover in Example 1 is used.

FIGS. 5(a) to 5(b) are views illustrating an operation when disposing the cover using an optical microscope in Example 1.

FIGS. 6(a) to 6(c) are views illustrating a case of operating a charged particle microscope using the cover in Example 1.

FIG. 7 is a view illustrating an operation procedure for using the cover in Example 1.

FIG. 8 is a view illustrating a shape of the cover in Example 1.

FIG. 9 is an overall configuration view of a charged particle microscope of Example 2.

FIGS. 10(a) to 10(c) are views illustrating a case of operating a charged particle microscope using a cover in Example 2.

FIG. 11 illustrates a relationship between drying time and evaporation time of water droplets.

FIGS. 12(a) to 12(b) are views illustrating the vicinity of a water-containing sample when the cover and a sealing member are used in Example 2.

FIGS. 13(a) to 13(b) are views illustrating the vicinity of the water-containing sample when the cover and the sealing member are used in Example 2.

FIGS. 14(a) to 14(b) are views illustrating the vicinity of the water-containing sample when the cover and the sealing member are used in Example 2.

FIGS. 15(a) to 15(b) are views illustrating the vicinity of the water-containing sample when the cover and the sealing member are used in Example 2.

FIG. 16 is a view illustrating an operation procedure for using the cover and the sealing member in Example 2.

DESCRIPTION OF EMBODIMENTS

Hereinafter, each embodiment will be described with reference to the drawings.

Hereinafter, as an example of a charged particle beam apparatus, a charged particle beam microscope will be described. However, this is merely an example of the present invention, and the present invention is not limited to the embodiments described below. The present invention can also be employed to a scanning electron microscope, a scanning ion microscope, a scanning transmission electron microscope, a composite apparatus of these and a sample processing apparatus, or an analysis/inspection apparatus applying these.

In addition, in the present specification, "atmospheric pressure" means an air atmosphere or a predetermined gas atmosphere, and means an atmospheric pressure or a pressure environment in a slightly negative pressure state. Specifically, the atmospheric pressure is approximately $10^5$ Pa (atmospheric pressure) to approximately $10^3$ Pa. In addition, the pressure range may also be referred to as "non-vacuum" in some cases.

Example 1

In this Example, a basic embodiment will be described. In FIG. 1, an overall configuration view of a charged particle microscope of the Example is illustrated. In addition, although the following examples are described with a scanning electron microscope intentionally, the present invention is not limited thereto as described above.

The charged particle microscope illustrated in FIG. 1 is a device for observing a sample by irradiating the sample disposed in a non-vacuum space and separated by a diaphragm from an inner space of a charged particle optical lens barrel, with a charged particle beam. The charged particle microscope illustrated in FIG. 1 mainly includes a charged particle optical lens barrel 2 which generates the charged particle beam, a housing (vacuum chamber) 7 which is connected to the charged particle optical lens barrel 2 and supports the same, a sample stage 5 which is disposed under the air atmosphere, and a control system which controls these elements. When the charged particle microscope is used, the inside of the charged particle optical lens barrel 2 and the housing 7 is evacuated by a vacuum pump 4. The activation and deactivation operation of the vacuum pump 4 is also controlled by the control system. In FIG. 1, only one vacuum pump 4 is illustrated, but two or more vacuum pumps 4 may be provided. The charged particle optical lens barrel 2 and the housing 7 are supported by a column which is not illustrated.

The charged particle optical lens barrel 2 is configured with elements, such as a charged particle source 8 for generating the charged particle beam, an optical lens 1 for focusing the generated charged particle beam to guide the beam to a lower part of the lens barrel and for scanning the sample 6 which serves a primary charged particle beam, and the like. In general, the atmosphere on the periphery of the charged particle source is an atmospheric pressure of $10^{-1}$ Pa or less (hereinafter, referred to as high vacuum) due to problems, such as the lifetime of the charged particle source. The charged particle optical lens barrel 2 is installed so as to protrude to the inside of the housing 7, and is fixed to the housing 7 via a vacuum sealing member 123. A detector 3 for detecting secondary charged particles (secondary electrons or reflected electrons) obtained by irradiating the end portion of the charged particle optical lens barrel 2 with the primary charged particle beam, is disposed. An image of the sample is obtained based on a signal obtained by the detector 3. The detector 3 may be on the outside or on the inside of the charged particle optical lens barrel 2. The charged particle optical lens barrel may include other lenses, electrodes, and detectors in addition to the above, or a part thereof may be different from that of the description above, and a configuration of a charged particle optical system included in the charged particle optical lens barrel is not limited to the description herein.

The charged particle microscope according to the Example includes, as a control system, a computer 35 used by the user of the apparatus, an upper control portion 36 which is connected to the computer 35 for communication, and a lower control portion 37 for controlling an evacuation system or a charged particle optical system according to a command transmitted from the upper control portion 36. The computer 35 includes a monitor on which an operation screen (GUI) of the apparatus is displayed, and input means for inputting to the operation screen, such as a keyboard or a mouse. The upper control portion 36, the lower control portion 37, and the computer 35 are connected by each of communication lines 43 and 44.

The lower control portion 37 transmits and receives a control signal for controlling the vacuum pump 4, the charged particle source 8, the optical lens 1 and the like, and further converts an output signal of the detector 3 into a digital image signal to transmit the signal to the upper control portion 36. In the drawing, the output signal from the detector 3 is connected to the lower control portion 37 via an amplifier 154, such as a preamplifier. When the amplifier is unnecessary, the amplifier may not be provided.

In the upper control portion 36 and the lower control portion 37, analog circuits, digital circuits, or the like may be mixed, and the upper control portion 36 and the lower control portion 37 may be integrated into one. In addition to this, the charged particle microscope may include a control portion for controlling the operation of each part. The upper control portion 36 and the lower control portion 37 may be configured as hardware by a dedicated circuit board, or may be configured with software executed by the computer 35. A hardware implementation can be realized by accumulating a plurality of computing devices performing processing on a wiring board or in a semiconductor chip or a package. A configuration with software can be realized by loading a high-speed general-purpose CPU on a computer and executing a program that executes a desired arithmetic processing.

A vacuum pipe 16 of which one end is connected to the vacuum pump 4 is connected to the housing 7, and it is possible to maintain the inside to be in a vacuum state. At the same time, a leak valve 14 for releasing the inside of the housing to the atmosphere is provided, and it is possible to open the inside of the housing 7 to the atmosphere during maintenance or the like. The leak valve 14 may not be provided or two or more leak valves 14 may be provided. In addition, the disposition location of the leak valve 14 in the housing 7 is not limited to a place illustrated in FIG. 1, and the leak valve 14 may be disposed at a different position on the housing 7.

In addition, the configuration of the control system illustrated in FIG. 1 is merely an example, and modification examples of the control unit, the valve, the vacuum pump, the communication wiring, and the like, are included in a category of the SEM or the charged particle beam apparatus as long as the functions intended in the present embodiment are satisfied.

On a lower surface of the housing, a diaphragm 10 is provided at a position immediately below the charged particle optical lens barrel 2. The diaphragm 10 is capable of allowing the primary charged particle beam emitted from the lower end of the charged particle optical lens barrel 2 to transmit or pass through, and the primary charged particle beam finally passes through the diaphragm 10 to reach the sample 6 loaded on a sample table 506. The closed space (that is, the inside of the charged particle optical lens barrel 2 and the housing 7) which is configured to be separated from a sample mounting space by the diaphragm 10, can be evacuated. In the Example, since the airtight state of the space evacuated by the diaphragm 10 is maintained, it is possible to maintain the charged particle optical lens barrel 2 in a vacuum state and to perform the observation by maintaining the atmosphere on the periphery of the sample 6 at an atmospheric pressure. In addition, even in the state of being irradiated with the charged particle beam, the space where the sample is installed communicates with the air atmosphere or the space in the air atmosphere, and thus, it is possible to freely replace the sample 6 during the observation.

The diaphragm 10 is formed or deposited on a diaphragm holding member 9. The diaphragm 10 is a carbon material, an organic material, a metal material, silicon nitride, silicon carbide, silicon oxide, or the like. The diaphragm holding member 159 is a member, such as silicon or a metal member. The diaphragm 10 may be multiple windows disposed in plural. The thickness of the diaphragm which is capable of allowing the primary charged particle beam to transmit or pass through is approximately several nm to several μm. It is necessary that the diaphragm does not break under a differential pressure for separating the atmospheric pressure from the vacuum. Therefore, the area of the diaphragm 10 is several tens of μm to at most several mm.

A fixing member 155 which supports the diaphragm 10 is provided on the diaphragm holding member 159. Although not illustrated, it is assumed that the fixing member 155 and the diaphragm holding member 159 adhere to a fixing member 155 or the like which will be described later by an O ring, a packing, an adhesive, a double-sided tape or the like which is capable of vacuum sealing. The diaphragm holding member 159 is fixed to be attachable from and detachable from the lower surface side of the housing 7 via a vacuum sealing member 124. On the request of allowing the charged particle beam to transmit, the diaphragm 10 is extremely thin to be several nm to several μm, and thus, there is a possibility that the diaphragm 10 deteriorates with time or breaks during the preparation for observation. In addition, since the diaphragm 10 and a base 9 which supports the diaphragm 10 are small, it is extremely difficult to directly handle the diaphragm 10 and the base 9. Therefore, as illustrated in the Example, by integrating the diaphragm 10 and the fixing member 155 with the diaphragm holding member 159 and by making it possible to handle (particularly, replace) the fixing member 155 not directly but via the diaphragm holding member 159, handling of the diaphragm 10 and the fixing member 155 becomes extremely easy. In other words, in a case where the diaphragm 10 is damaged, the entire fixing member 155 may be replaced. Even in a case where the diaphragm 10 should be directly replaced, by taking out the entire fixing member 155 to the outside of the apparatus, and by detaching the diaphragm 10 from the fixing member 155 integrated with the diaphragm 10, it is possible to replace the fixing member 155 on the outside of the apparatus by performing detaching work of the diaphragm 10.

The sample of the present charged particle microscope is disposed on the sample stage 5. The sample stage 5 has at least a Z axis driving mechanism. The Z axis direction indicates a direction 54 of the optical axis of the charged particle beam. The Z axis driving mechanism is a mechanism used for arbitrarily adjusting the distance between the sample 6 and the diaphragm 10. In addition, the sample stage 5 of the charged particle microscope may have an XY plane driving mechanism. The XY plane indicates a plane perpendicular to the above-described Z axis. An XY plane moving mechanism is a mechanism used for observing an arbitrary part on the sample stage. Accordingly, it is possible to search for an arbitrary observation target part on the sample and to move to the center of a visual field.

In the charged particle microscope that can perform observation under atmospheric pressure, in order to suppress scattering of charged particle beams and to prevent the diaphragm from breaking by contact with the sample, it is necessary to adjust the distance between the diaphragm 10 and the observation target part of the sample 6 is several hundreds of μm to several tens of μm or several μm. The operation is extremely delicate, making the work of bringing the diaphragm and the sample close to each other convenient substantially contributes to the improvement of the convenience of the charged particle microscope which performs the observation under the atmospheric pressure.

In addition, although not illustrated, an optical microscope which is capable of observing the sample may be disposed immediately below or in the vicinity of the sample 6. In this case, the diaphragm 10 is on the upper side of the sample, and the optical microscope is observed from the lower side of the sample. Therefore, in this case, it is necessary for a sample table 52 to be transparent with respect to the light of the optical microscope. As the transparent member, transparent glass, transparent plastic, transparent crystal body and the like are used. As a more general sample table, a transparent sample table, such as a slide glass (or preparation) or a dish (or petri dish), is employed.

In addition, a temperature heater or a voltage applying unit which is capable of generating an electric field in the sample, may be provided. In this case, it is possible to observe an aspect in which the sample is heated or cooled or an aspect in which the electric field is applied to the sample.

In addition, in FIG. 1, the detector 3 is in the vacuum space 11, but a transmission detector which is capable of detecting a transmission signal may be located immediately below or in the vicinity of the sample.

Two or more diaphragms may be disposed. For example, a diaphragm may be provided on the inside of the charged particle optical lens barrel 2. Otherwise, below the first diaphragm which separates the vacuum and the atmosphere from each other, a second diaphragm may be provided, and the sample may be contained between the second diaphragm and the sample stage.

In the present invention, regardless of the number and type of diaphragms, the invention is included in the category of the SEM or the charged particle beam apparatus as long as the functions intended in the Example are satisfied.

(Explanation of Cover)

When using the apparatus of FIG. 1, since the sample can be disposed in the atmosphere, it is possible to perform the observation with the charged particle microscope with respect to the sample in a state of containing moisture. However, it has been difficult to observe the sample containing a large amount of moisture. The reason thereof will be described with reference to FIGS. 2(*a*) to 2(*c*). In a case where a large amount of moisture is contained in the sample 6, the liquid droplets are often formed on the surface of the sample. In this state, when the sample 6 is brought close to the diaphragm 10, a liquid droplet 500 on the sample surface is observed. Since the penetration depth (or mean free pass) of the charged particle beam into a substance is short, when the liquid droplet is attached to the sample part to be observed, the charged particle beam cannot reach the surface of the sample 6. Therefore, a problem that it is difficult to observe the sample surface on which water droplets remain, is generated.

In such a case, it seems that it is possible to observe a sample part 6*a* to which the liquid droplet does not adhere, but practically, it is difficult to perform the observation in many cases even in a case where the liquid droplet 500 does not adhere to the sample part 6*a*. For example, a case where there are no liquid droplets at the sample part 6*a* to be observed, and the liquid droplet 500 exists outside of a range of a window length Dm of the diaphragm 10, is considered. Under such circumstances, when making the sample 6 approach the diaphragm 10, the liquid droplet 500 comes into contact with a base 159 which holds the diaphragm (contact part 508). Since the charged particle beam emitted from the charged particle microscope can only be observed within the range of the window length Dm of the diaphragm 10, it is not possible to observe the contact part 508, and thus, an operator of the apparatus cannot recognize that the liquid droplet 500 has come into contact with the base 159. As a result, the operator of the apparatus further brings the sample 6 close to the diaphragm 10 in a state where it is not known that the liquid droplet 500 has come into contact with the diaphragm holding member 159. After this, the liquid droplet 500 spreads and reaches the diaphragm 10. At the part (A) at which the liquid droplet exists, the charged particle beam does not reach the sample 6, the sample surface of the A portion cannot be observed. In this manner, even when there is no liquid droplet at the sample part 6*a* to be observed, it is difficult to perform the observation in a case where the liquid droplet 500 exists outside of the range of the window length Dm of the diaphragm 10.

As a method for solving this problem, it is necessary for the liquid droplet not to be on the sample 6 within the range of the width Dw of the diaphragm holding member 159, but in general, since the width Dw of the diaphragm holding member 159 is several mm to several tens of mm (the shape of the diaphragm is illustrated in FIG. 3(*a*)), it is substantially difficult to achieve such a situation with a water-containing sample containing a large amount of moisture.

In order to solve the problem, a member illustrated in FIG. 3(*b*) is used as an observation support unit (hereinafter referred to as a cover). For example, a cover 501 illustrated in FIG. 3(*b*) is a ring-shaped component having a thickness t with an outer diameter Do and an open hole with an inner diameter Di. Although the sample immediately below a main body portion 501*b* of the cover cannot be observed, the sample can be observed through a hole portion 501*a*. The cover 501 is immediately mounted on the sample. When the cover 501 is mounted on the sample, the hole portion 501*a* of the cover 501 forms an observation region for observing the sample, and the cover main body portion 501*b* serves as a part for covering the sample. By the cover, the sample and the diaphragm are kept in a non-contact state.

By using FIGS. 4(*a*) to 4(*c*), a method for using the cover 501 will be described. The main body portion 501*b* of the cover 501 is held with tweezers or the like, and the sample part 6*a* to be observed is held immediately below the hole 501*a* of the cover 501 (FIG. 4(*a*)). Next, the cover 501 is loaded on the sample 6. In a case where the liquid droplet 500 is present on the sample 6, the liquid droplet 500 is divided into a liquid droplet 500*b* that spreads to the inside of the hole 501*a* of the cover and a liquid droplet 500*a* that spreads between the main body portion 501*b* of the cover and the sample 6 (FIG. 4(*b*)). Next, since the liquid droplet 500*b* is an obstacle to the observation of the charged particle microscope, the liquid droplet 500*b* is removed by filter paper 502 or the like. In addition, the liquid droplet 500*b* may be blown off by applying an air pressure. In this manner, it is possible to achieve a state where the liquid droplet does not exist only on the sample surface at the part opened by the hole 501*a* of the cover (FIG. 4(*c*)). In general, when all of the moisture of the water-containing sample is attempted to be removed, the sample is dried, and thus, the water-containing sample is not appropriate for the observation. For example, when the liquid droplet on the surface of the water-containing sample is removed by the filter paper or the like, the water-containing sample is extremely dried. Meanwhile, when the cover 501 is used in this manner, in a state where the moisture remains under the cover 501, it is possible to remove the liquid droplet only in the region to be observed, and it is possible to observe the sample with the charged particle microscope in a state where the drying is prevented.

In summary, the hole 501*a* of the cover becomes an observation region, and the main body portion 501*b* of the cover 501 becomes a non-observation region. Here, the observation region means a region to be used as an observation window when observing the sample, and the non-observation region means a part that covers the sample and a region in which the sample that is an observation target cannot be observed.

In FIG. 3(*b*), a ring shape having one hole portion is taken as an example, but as a modification example of the Example, for example, not one hole portion 501*a* of the cover but a plurality of hole portions having a shape of a mesh may be provided. In addition, the outer shape of the sheet may not be circular, and by arranging two or more sheet-like covers, a gap therebetween may be set as the observation region 501*a*. In this case, it can also be said that a plurality of sheets are combined to each other to form one cover. A unit in which the cover is formed by combining a plurality of members to each other in this manner, is referred to as an observation support unit.

(Description of Optical Microscope)

As will be described later, since a region to be observed with the charged particle microscope is small, it is desirable that the hole 501a of the cover is as large as or slightly larger than the window area of the diaphragm. Therefore, in order to precisely align the hole 501a of the cover with the sample part 6a to be observed, it is desirable to perform the work of loading the cover 501 onto the sample 6 under an optical microscope.

FIGS. 5(a) and 5(b) illustrate an aspect in which the cover 501 is used with an optical microscope. FIG. 5(a) illustrates an aspect immediately after installing the sample on the optical microscope, and FIG. 5(b) illustrates an aspect after loading the cover 501 and removing the excessive liquid droplet 501b. An optical microscope 402 has an objective lens 412 which is capable of condensing light, a position driving mechanism portion 406 and a base 407 which are capable of driving the position of the optical microscope. The base 407 includes a sample disposing portion 401 on which the sample table 506 can be loaded. After installing the sample table 506 in the sample disposing portion 401, the sample is loaded on the sample table. After this, while performing the observation with an optical microscope, the cover 501 is disposed such that the hole 501a of the cover is positioned at the sample 6a to be observed.

(Explanation of Approach)

FIGS. 6(a) to 6(c) illustrate an aspect in which the sample 6 on which the cover 501 is loaded is installed in a charged particle microscope apparatus. At first, as illustrated in FIG. 6(a), there is a case where the sample part 6a to be observed is not immediately below the diaphragm 10. Therefore, it is necessary to move the sample in the direction of the white arrow in the drawing. At this time, the sample is moved in the horizontal direction in the drawing (in a plane perpendicular to the optical axis of the charged particle beam) at the position (distance h1) at which the diaphragm 10 and the sample 6 does not come into contact with each other and are sufficiently separated from each other. FIG. 6(b) illustrates an aspect in which the sample part 6a to be observed comes immediately below the diaphragm 10. After this, by bringing the sample 6 close to the diaphragm 10, the sample 6 is irradiated with the charged particle beam, and by detecting charged particle beams, such as secondary electrons and reflected electrons emitted from the sample 6, and radiation, such as X-rays and luminescence, it is possible to obtain a microscopic image.

Since the thickness t of the cover 501 is known, the cover 501 functions as a distance restriction member in order to restrict the distance between the diaphragm 10 and the sample 6. The penetration depth (or mean free pass) of the charged particle beam on the inside of the substance is short. In an acceleration voltage of the charged particle beam of a general charged particle beam microscope apparatus, the penetration depth (or mean free pass) is approximately several µm to 1 mm or less. For example, the mean free pass (MFP) in a case where an electron beam with an acceleration voltage of 15 kV is emitted at the atmospheric pressure, is approximately several tens of µm. Here, the thickness of the cover is set to be equal to or less than the above-described value (mean free pass of the charged particle beam under the observation condition).

$$MFP \geq t \quad \text{Expression 1}$$

When the cover has a thickness that satisfies Expression 1, the charged particle beam reaches the sample surface before the sample below the cover 501 and the diaphragm 10 come into contact with each other. In other words, in a state where the cover 501 and the diaphragm holding member 159 come into contact with each other, it is possible to bring the sample close to the diaphragm 10 after the mean free pass. Therefore, the cover 501 in the present invention can also be used for the purpose of safely bringing the sample 6 and the diaphragm 10 close to each other. In addition, here, the thickness of the cover means the thickness of the periphery of the hole portion of the cover (at least the part facing the diaphragm holding member), and it is not necessary to be the thickness of the entire cover.

In addition, in a case of a material by which the sample is easily deformed, when the sample stage 15 is moved so as to further bring the sample 6 and the diaphragm 10 close to each other after bringing the diaphragm holding member 159 and the cover 501 into contact with each other, there is a case where the sample 6 is deformed being nipped between the cover 501 and the sample holder. In such a case, there is also a possibility that the diaphragm 10 and the sample 6 come into contact with each other. At this time, the position of the sample part 6a to be observed from the hole portion 501 of the cover moves in the horizontal direction, or the movement that causes the shape to collapse is observed. Therefore, when the movement that causes the shape to collapse or spread is observed when the sample 6 is observed, by stopping driving the sample stage or the like, it is possible to prevent the diaphragm 10 and the sample 6 from coming into contact with each other.

In addition, since the thickness t of the cover is required to be equal to or less than the length of the mean free pass of the charged particle beam due to the above-described reasons, the thickness is extremely thin, and thus, the cover 501 needs to be operated with tweezers or the like. In order to accurately operate the thin cover with tweezers, it is more desirable to carryout the operation under an optical microscope as illustrated in FIGS. 5(a) and 5(b).

(Regarding Materials)

In addition, it is desirable that the cover 501 in the Example is a material different from the sample 6. The effects in a case where the materials of the cover 501 and the sample 6 to be observed are different from each other will be described by using FIG. 6(a). In a case where the hole 501a of the cover does not exist immediately below the diaphragm 10, the operator needs to adjust the position using the sample stage such that the hole 501a of the cover is positioned immediately below the diaphragm in the charged particle microscope. Here, in a case where the materials of the cover 501 and the sample 6 are different from each other, the cover 501 and the sample 6 are microscopic images having different contrasts. In other words, it is preferable that the main body portion of the cover 501 is made of a material different from that of the main component of the sample. More specifically, in a case where the materials of the cover 501 and the sample 6 are different from each other, signal amounts are different from each other in a secondary charged particle beam 506 generated by irradiating the sample 6 with a primary charged particle beam PE1 through the hole 501a of the cover, and in a secondary charged particle beam 507 generated by irradiating the cover 501 with a primary charged particle beam PE2. For example, in a case where the sample 6 is an organic material, such as a biological sample, and the cover 501 is a metal material, the amount of the secondary charged particle beam 507 is more than that of the secondary charged particle beam 506, and thus, the cover 501 part is observed to be brighter in the charged particle microscope image. In other words, by bringing the diaphragm 10 and the sample 6 close to each other by the distance (h1) to the extent that the difference in brightness can be seen, and by moving the diaphragm 10 and the sample 6 in the XY plane direction using the sample stage 5, it becomes easy to search for the sample part to be observed darkly (that is, the hole portion 501a of the cover). Here, it is not necessary that the entire main body portion of the cover 501 is made of a material different from that of the sample, and for example, only the peripheral part of the hole portion of the cover may be made of a material different from that of the sample. In addition, there may be markings made of different materials for indicating the hole portion direction of the cover such that the hole portion direction of the cover can be seen. Otherwise, the process of covering may itself be used to indicate the hole portion direction of the cover. By doing this, it becomes easy to search for the hole portion in a case where the hole portion is at a position at which the hole portion is not observed.

For example, in a case of a biological tissue of an animal or a plant tissue material; a processed material, such as food made by using a material from animals and plants as raw materials; an organic material or a soft material which can contain the moisture therein; an inorganic material in a state where liquid components are included in the sample or the liquid components adhere to the sample surface; and an organic or inorganic material having a high viscosity, such as paste, sol, or gel, the cover 501 may be a metal material. In this case, as the material of the cover, metal, such as aluminum, molybdenum, tungsten, platinum, copper, iron, or SUS, may be particularly employed. Meanwhile, in a case where the sample is made of metal or a semiconductor, the cover member 501 may be a member made of an organic material, such as plastic. Therefore, the plurality of covers made of different materials are prepared, and the cover may be used properly depending on the sample that serves as an observation target. In addition, since the thickness t of the cover 501 is extremely thin as described above, it is preferable that the cover 501 is made of a flexible material without being easily broken.

(Description of Each Step)

By using FIG. 7, a procedure of the observation using the observation support unit of the Example will be described. First, the sample 6 is loaded on the sample table 506. In the next step, the sample table 506 can be loaded on the table 401 on which the sample table 506 can be loaded and which is provided in the optical microscope 402. An order of the two steps may be reversed. In the next step, observation is started by matching a focal position 408 of the objective lens 412 of the optical microscope 402 to the sample 6 by using the height adjusting mechanism 406 provided in the optical microscope. The state is illustrated in FIG. 5(a). In the next step, the sample part 6a to be observed with the optical microscope is found. At this time, a sample stage which is not illustrated as being included in the optical microscope may be used, the sample may be moved with tweezers or the like, or a driving mechanism which is capable of changing a sample position provided in the sample table 506 may be used. In addition, the step of loading the sample on the sample table may be performed under the optical microscope. In order to make it possible to perform the observation of the sample part 6a to be observed from the beginning under the optical microscope, marks which are not illustrated may be marked on the sample table 506 in advance. In the next step, the cover 501 is disposed on the sample 6a to be observed. At this time, by holding the main body portion 501b of the cover 501 with tweezers or the like, and the sample part 6a to be observed is disposed immediately below the hole 501a of the cover 501. Here, it is preferable that a series of operations are performed using the optical microscope. Next, excessive liquid droplets 500 on the sample surface exposed from the cover hole 501a portion are removed with the filter paper or the like. The state is illustrated in FIG. 5(b).

After this, the sample table 506 is disposed in the charged particle microscope apparatus and observation is started. Next, the hole portion 501a is identified using the difference in contrast (brightness) in the charged particle microscopic image of a sample portion exposed from the cover portion (cover main body portion) and the cover hole portion, and by moving the sample stage, the hole portion 501a is disposed immediately below the diaphragm. Next, by bringing the sample on which the cover is loaded close to the diaphragm 10 by the distance (h1) to the extent that the shape of the cover or the position of the hole portion 501a of the cover can be confirmed, it is possible to observe the sample part 6a. In the step of bringing the diaphragm 10 and the sample 6 close to each other, the cover 501 and the diaphragm holding member 159 may be brought into contact with each other. In other words, the distance h2 between the cover 500 and the diaphragm holding member 159 may be set to be zero. When the thickness of the cover 500 is t, when the height of the sample part that protrudes further than the hole 501a of the cover is smaller than the thickness t, the sample does not come into contact with the diaphragm 10.

(Contact Recognition Means)

As means for recognizing that the diaphragm 10 and the sample 6 are brought close to each other and the cover 501 and the diaphragm holding member 159 comes into contact with each other, in a case where the sample is made of a material that is easily deformed as described above, by bringing the sample and the diaphragm close to each other while checking the image, an aspect in which the sample moves in the horizontal direction and the shape thereof changes are observed when the cover 501 and the diaphragm holding member 159 are brought into contact with each other. Accordingly, it is possible to recognize that the cover 501 and the diaphragm holding member 159 come into contact with each other. In a case of automatic recognition by the computer, it is also possible to display an alert on a display in a case where the acquired image monitored in real time and a change in sample shape is detected in the image.

When the sample is made of a material that is not easily deformed, it is not possible to move the sample in the Z axis direction by the sample stage 5 after bringing the cover 501 and the diaphragm holding member 159 into contact with each other, and thus, it is not possible to recognize the contact state. In addition, since the diaphragm 10 moves in any direction among upward, downward, leftward, or rightward directions together with the diaphragm holding member 159 as the cover 501 pushes the diaphragm holding member 159, it is possible to recognize that the cover 501 and the diaphragm holding member 159 are brought into contact with each other by observing the aspect. In this case, automatic recognition by the computer is also possible by monitoring the image as described above.

(Regarding Each Size)

Hereinafter, regarding each size, it is assumed that each member is circular in the description, but in a case where the shape is not circular, each size may be read as a numerical value that represents the size of the shape of each member, such as the length of the diagonal line or the diameter of the circumscribed circle. For example, in the following expressions and explanations, each size is described as a diameter and a window length, but it is also possible to determine the area.

First, since the visual field becomes narrow as the diameter Di of the hole portion 500a of the cover is smaller than the window length Dm (a part through which the charged particle beam passes is referred to as "window") of the diaphragm 10, Di Dm is preferable. However, when the diameter Di of the hole portion 500a of the cover is larger than the window length Dm of the diaphragm 10, the amount of the liquid droplets 500 that should be removed increases, and thus, the diameter Di of the hole portion 500a of the cover may be slightly larger than the window length Dm of the diaphragm 10. It is preferable that the length Dw of at least the diaphragm holding member is short.

In addition, when the outer diameter Do (that is, the diameter of the cover main body) of the cover 501 is smaller than the length Dw of the diaphragm holding member 159, there is a possibility that the liquid droplet 500 comes into contact with the diaphragm holding member 159 from the outside rather than the outer diameter of the cover 501, and thus, it is desirable that the outer diameter Do of the cover 501 is larger than the length Dw of the diaphragm holding member 159.

As a result, it is preferable that the following expression is roughly established. The aspect is illustrated in FIG. 8.

$$Do > Dw > Di \geq Dm \quad \text{Expression 2}$$

In addition, in order to further simplify the operation of the cover 500 with tweezers, it is desirable that the outer diameter Do of the cover 501 is, for example, several mm or more.

In addition, considering operability with tweezers, a case where the cover holding member 508 which is made of a material that is harder or thicker than the main body portion 501b of the cover 501 is provided at an outer circumference of the cover 501 in the cover 501, is preferable for improving the operability. The thickness of the cover holding member 508 should not be such a size that becomes an obstacle when the cover 501 approaches the diaphragm 10. For example, it is desirable that a thickness t1 of the cover holding member 508 is thinner than a distance t2 between the fixing member 155 which supports the diaphragm holding member 159 and the diaphragm 10.

$$t1 > t2 \quad \text{(Expression 3)}$$

In addition, the cover holding member 508 may not be a component provided to be separated from the cover main body portion. For example, the outer circumferential portion of the cover main body portion may be made of a material which is thicker or harder than the periphery of the cover hole portion of the cover main body portion.

In addition, the thickness of the non-observation region 501b (cover main body portion) in the vicinity of the hole portion 501a which is the observation region needs to be constant at least at the thickness t. By doing so, observation can be performed while keeping the distance between the diaphragm 10 and the observation sample 6 to be constant.

Example 2

As described in the Example 1, since the water-containing sample is observed as an observation sample, the liquid droplet exists on the part 6a to be observed in many cases. In such a case, in a case where it is difficult to remove the water droplets on the sample part 6a to be observed with the filter paper or the like, it is desirable to perform the observation by evaporating the water droplets only on the surface of the part to be observed. Here, in the Example, an apparatus and a method which can dry the water droplets of the sample part 6a to be observed will be described. FIG. 9 illustrates a charged particle microscope used in the Example.

FIG. 9 illustrates the overall configuration view of the charged particle microscope of the Example. The charged particle microscope of the Example is configured with a charged particle optical lens barrel 2, a first housing (vacuum chamber) 7 for supporting the charged particle optical lens barrel with respect to an apparatus installation surface, a second housing (attachment) 121 used for insertion into the first housing 7, and a control system.

In a case of the charged particle microscope of the Example, at least one side surface (the open surface of the second housing 121) of the second space can be covered with a lid member 122, and various functions can be realized. Hereinafter, this will be explained.

In the charged particle microscope of the Example, it is possible to set a space 12 in which the sample is disposed under a slightly reduced pressure vacuum condition to be lower than the pressure set at atmospheric pressure (approximately $10^5$ Pa) to approximately $10^3$ Pa using a vacuum pump 103. The charged particle beam emitted from the lower end of the charged particle optical lens barrel 2 passes through the diaphragm 10 illustrated in FIG. 9 through the first space 11 maintained at a high vacuum, and furthermore, the charged particle beam enters the second space 12 maintained at the atmospheric pressure or in the desired pressure or gas state. The atmosphere in the second space has a pressure which is the atmospheric pressure or a pressure which is the same as the atmospheric pressure. Since the charged particle pass is scattered by gas molecules, the mean free pass becomes short. In other words, when the distance between the diaphragm 10 and the sample 6 is long, the charged particle beam does not reach the sample. Due to the above-described reasons, in the charged particle microscope of the Example, an attachment portion of the vacuum pipe 100 is provided in the lid member 122. The vacuum pipe 100 is linked to the vacuum pump 103 by a linking portion 102, and accordingly, it is possible to reduce the pressure on the inside of the second space 12. A gas control valve 101 is disposed in the middle of the vacuum pipe 100, and it is possible to control the gas flow rate for exhausting the inside of the pipe. Therefore, a signal line extends from the gas control valve 101 to the lower control portion 37, and the user of the apparatus can control the exhaust amount on an operation screen displayed on a monitor of the computer 35. In addition, the gas control valve 101 may be manually operated to be open and closed. In addition, there is a case where the vacuum pump 103 is provided in the charged particle microscope, and there is also a case where the user of the apparatus attaches the vacuum pump 103 later.

In this manner, in the Example, the space where the sample is mounted can be controlled to an arbitrary degree of vacuum from atmospheric pressure (approximately $10^5$ Pa) to approximately $10^3$ Pa. In a so-called low vacuum scanning electron microscope of the related art, since the electron beam column communicates with the sample chamber, when the vacuum degree in the sample chamber is reduced and the pressure becomes close to the atmospheric pressure, the electron beam column also changes in conjunction therewith, and it is difficult to control the sample chamber at a pressure of the atmospheric pressure (approximately $10^5$ Pa) to approximately $10^3$ Pa. According to the Example, since the second space and the first space are separated from each other by a thin film, the pressure of the atmosphere in the second space surrounded by the second housing 121 and the lid member 122 and the gas type can be freely controlled. Therefore, it is possible to control the sample chamber to the pressure of the atmospheric pressure (approximately $10^5$ Pa) to approximately $10^3$ Pa, which has been difficult to be controlled so far. Furthermore, it is possible not only to perform the observation at the atmospheric pressure (approximately $10^5$ Pa) but also to observe the state of sample by continuously changing the pressure to the pressure which is close to the atmospheric pressure.

Next, a position adjustment method of the sample 6 will be described. The charged particle microscope of the Example is provided with the sample stage 5 as means for moving the observation visual field. The sample stage 5 is provided with an XY driving mechanism in the in-plane direction and a Z-axis driving mechanism in the height direction. A support plate 107 serving as a bottom plate for supporting the sample stage 5 is attached to the lid member 122, and the sample stage 5 is fixed to the support plate 107. The support plate 107 is attached so as to extend toward the inside of the second housing 121 toward the surface facing the second housing 121 of the lid member 122. Spindles respectively extend from the Z axis driving mechanism and the XY driving mechanism, and are respectively linked to an operation knob 108 and an operation knob 109. The user of the apparatus adjusts the position of sample 6 in the second housing 121 by operating these operation knobs 108 and 109.

Next, a mechanism for replacing the sample 6 will be described. In the charged particle microscope of the present embodiment, a lid member support member 19 and a bottom plate 20 are provided respectively on the bottom surface of the first housing 7 and on the lower surface of the lid member 122. The lid member 122 is detachably fixed to the second housing 121 via a vacuum sealing member 125. Meanwhile, the lid member support member 19 is also detachably fixed to the bottom plate 20, and as illustrated in FIG. 9, it is possible to entirely detach the lid member 122 and the lid member support member 19 from the second housing 121. In addition, in FIG. 9, an electrical wiring and the like are omitted.

The bottom plate 20 is provided with a support column 18 which is not illustrated and used as a guide at the time of detachment. In a state of normal observation, the support pillar 18 is stored in a storage portion provided in the bottom plate 20, and is configured to extend in the pull-out direction of the lid member 122 at the time of detachment. At the same time, when the support 18 is fixed to the lid member support member 19, and the lid member 122 is detached from the second housing 121, the lid member 122 and the charged particle microscope main body are not completely separated from each other. Thereby, it is possible to prevent the sample stage 5 or the sample 6 from falling.

In a case of transporting the sample into the second housing 121, first, the sample 6 is moved away from the diaphragm 10 by rotating the Z axis operation knob of the sample stage 5. After this, after confirming that the inside of the second housing is not in a depressurized state or in an extremely pressurized state, the lid member 122 is pulled out to the side opposite to the apparatus main body. Accordingly, the sample 6 is placed in a replaceable state. After the sample replacement, the lid member 122 is pushed into the second housing 121, the lid member 122 is fixed to a matching part 132 with a fastening member which is not illustrated, and then, an exchange gas is introduced as necessary. The above-described operation can also be executed in a state where a high voltage is applied to an optical lens 2 on the inside of the electron optical lens barrel 2 or in a state where the electron beam is emitted from the charged particle beam source 8. Therefore, in the charged particle microscope of the Example, after the sample replacement, the observation can be rapidly started.

As described above, in the Example, all of the sample stage 5, the operation knobs 108 and 109, the vacuum pipe 100, and a pressure adjusting valve 104 are collectively attached to the lid member 122. Therefore, the user of the apparatus can perform the operation of the operation knobs 108 and 109, the replacement operation of the sample, or the attachment and detachment operation of the vacuum pipe 100 and the pressure adjusting valve 104, with respect to the same surface of the first housing. Accordingly, compared to the charged particle microscope in which the above-described configuration component is attached to the other surface of the sample chamber in a scattered manner, the operability when changing the state for the observation under the atmospheric pressure and the state for the observation under the high vacuum to each other, is substantially improved.

Here, as illustrated in FIG. 10(*a*), a state where the water droplet 500*b* is attached to the part 6*a* to be observed is considered. In this case, as described in the Example 1, since the water droplets cannot be removed by the cover 501, it is considered to remove the water droplets by bringing the filter paper 502 into contact with the observation part 6*a*. However, there is also a case where it is not desired to bring the filter paper into contact with the part 6*a* to be observed on the sample. In this case, the apparatus of FIG. 9 may be used for removing the water droplets. In other words, in a state where the sample 6 is in the vicinity of the diaphragm 10, the second space 12 is evacuated by the vacuum pump 103. Here, the "evacuation" refers to a state where the pressure is slightly reduced to be lower than 1 atm.

FIG. 11 illustrates an experiment example in which the relationship between the pressure and the time at which the water droplets actually evaporates is acquired. This is the result of experiment under the room temperature condition regarding approximately when the drop of water evaporates after putting one drop (10 µL) of water on an aluminum table. The time required for evaporation of 10 µL of water droplets to evaporate at 1 atm (100 kPa) is approximately 120 minutes, but the time required for 10 µL of water droplets to evaporate at 0.3 atm (30 kPa) is approximately 20 minutes. In this manner, the time for evaporation of the water drops at a depressurized state is shorter than that at the atmospheric pressure (1 atm). In addition, at 0.1 atm (10 kPa) or lower, phenomena, such as rapid evaporation of the water droplets or freezing due to evaporation heat of the water drop evaporation, are observed. This is because, since the saturated upper pressure at a room temperature is approximately 0.03 atm (3000 Pa), evaporation proceeds at an extremely fast speed. Therefore, it is desirable to evaporate the water droplets at 0.1 atm (10 kPa) or higher. As described above, when evacuating the space where the sample that is in a state where the cover is loaded is mounted by using the apparatus of FIG. 9 that can be in a state of 1.0 atm or lower, without directly coming into contact with the sample, it is possible to remove the liquid droplets of the surface of the sample 6*a* exposed to the cover hole portion as illustrated in FIG. 10(*b*).

Meanwhile, since the moisture evaporation speed is high in a state under the reduced pressure of 1 atm or lower, the moisture on the inside of the sample or the liquid droplet 500*a* below the cover 501 may not be provided depending on the size and the type of the sample. The state is illustrated in FIG. 10(*c*). In order to solve the problem, as illustrated in FIG. 12(*a*), the cover 501 is provided with a sealing member 503 for restricting the moisture evaporation from the sample 6. When the sealing member 503 is provided, the evaporation of the liquid droplet 500a on the lower surface of the cover 501 is restricted, evaporation proceeds only from the hole portion of the cover 501, and thus, the water droplets which adhere to the sample 6a first evaporate (FIG. 12(b)). Meanwhile, since the space 13 is not directly linked to the space 12 by the sealing member 503, the evaporation speed is low. As a result, it is possible to observe the part to be observed in a state where the water droplets are not attached to the surface of the sample part 6a to be observed and in a state where the entire sample 6 is not dried or shrunk.

The sealing member 503 comes into contact with or tightly adheres to the cover 501 and the sample table 506, and seals the space between the cover main body portion and the sample table. Accordingly, the water droplets of the sample and the periphery thereof are stored on the inside. Similar to the double-sided tape, the sealing member 503 may be an adhesive material that allows the cover 501, the sample table 506, and the sealing member 503 to be brought into tight contact with each other. In addition, as illustrated in FIG. 13(a), for example, a member which solidifies similar to an adhesive may be used. Further, a part for fixing the sample table and the cover 501 to each other with screws or clamps which is not illustrated. In FIGS. 12(a) and 13(b), the upper surface of the sample table 506 and the sealing member 503 in the drawing come into contact with each other, but the sealing member 503 may come into contact with the side surface or the lower surface of the sample table 506 as illustrated in FIG. 13(b). In this manner, it is possible to further separate the space 13 and the space 12 from each other.

In addition, when the space 12 and the space 13 are extremely separated from each other, and a pressure difference occurs between the space 12 and the space 13, the moisture evaporates only from the hole portion of the cover 501. As a result, a problem occurs that the moisture 500b of the part 6a to be observed always remains. In order to prevent the pressure difference from occurring between the space 12 and the space 13, the sealing member 503 may be provided with a vent 507 as illustrated in FIG. 13(b). The vent 507 has an area or conductance which is smaller than that of the hole portion 501a of the cover 501. A plurality of vents 507 may be provided, or the vent 507 may be provided between the cover 501, the sealing member 503, and the sample table 506. In other words, the vent 507 may be a hole other than the hole portion of the cover which communicates with the outside, from the space surrounded by the cover 501, the sample table 506, and the sealing member 503.

As illustrated in FIGS. 14(a) and 14(b), the sealing member 504 may be above the cover 501. However, in this case, it is necessary that the diaphragm holding member 159 or the base 155 comes into contact with each other when the part which extends further to the upper side than the cover 501 does not bring the diaphragm 10 and the sample 6 close to each other. For example, in a case where the diaphragm holding member 159 that holds the diaphragm 10 is provided on the base 155 as illustrated in the drawing, it is necessary that the thickness t1 of the part which extends further to the upper side than the cover 501 is less than a thickness t0 of the diaphragm holding member 159.

$$t0 \geq t1 \qquad \text{Equation 4}$$

In addition, since the cover 501 is formed with a shorter thickness than that of the mean free pass of the electron beam, the cover 501 may be bent toward the sample table 506 side as illustrated in FIG. 15(a) (507 portion in the drawing). In this case, since the upper surface of the cover 501 can be disposed at the same surface as or above the upper surface of the sealing portion 504, in this case, it is not necessary to satisfy the expression 4.

A method of using the sealing portion 503 or 504 in the Example will be described by using FIG. 16. First, the sample 6 is loaded on the sample table 506. In the next step, the sample table 506 is loaded on the table 401 on which the sample table 506 can be loaded and which is provided in the optical microscope 402. The order of the two steps may be reversed. In the next step, observation is started by matching the focal position 408 of the objective lens 412 of the optical microscope 402 to the surface of the sample 6 by using the height adjusting mechanism 406 provided in the optical microscope. In the next step, the sample part 6a to be observed with the optical microscope is found. In the next step, the cover 501 is disposed on the sample part 6a to be observed. Here, as necessary, excessive liquid droplets 501b in the cover hole 501a portion are removed with filter paper or the like. In the next step, the sealing member 503 or 504 is attached. In addition, the sealing member 503 or 504 may be attached to the sample table or the cover 501 from the beginning. The following steps are the same as those in FIG. 7.

In addition, the present invention is not limited to the above-described examples, but includes various modification examples. For example, the above-described examples have been described in detail in order to make it easy to understand the present invention, and are not necessarily limited to those having all the described configurations. In addition, a part of the configuration of a certain example can be replaced by the configuration of another example, and the configuration of another example can also be added to the configuration of a certain example. Further, it is possible to add, delete, or replace other configurations with respect to a part of the configuration of each of the examples. In addition, each of the above-described configurations, functions, processing portions, processing means, and the like may be realized by hardware by designing a part or all of them, for example, by an integrated circuit. Further, each of the above-described configurations, functions, and the like may be realized by software by interpreting and executing a program by which the processor realizes each function.

Information of programs, tables, files, and the like that realize each function can be stored in a recording device, such as a memory, a hard disk, a solid state drive (SSD), or a recording medium, such as an IC card, an SD card, and an optical disk.

In addition, control lines or information lines indicate those which are considered to be necessary for the description, and all the control lines and information lines are not necessarily illustrated for products. In practice, it may be considered that almost all of the configurations are connected to each other.

REFERENCE SIGNS LIST

1: OPTICAL LENS, 2: CHARGED PARTICLE OPTICAL LENS BARREL, 3: DETECTOR, 4: VACUUM PUMP, 5: SAMPLE STAGE, 6: SAMPLE, 7: HOUSING, 8: CHARGED PARTICLE SOURCE, 9: BASE, 10: DIAPHRAGM, 11: FIRST SPACE, 12: SECOND SPACE, 13: SPACE, 14: LEAK VALVE, 15: OPEN SURFACE, 16: VACUUM PIPE, 35: COMPUTER, 36: UPPER CONTROL PORTION, 37: LOWER CONTROL PORTION, 43, 44: COMMUNICATION LINE, 52: SAMPLE TABLE, 53: CHARGED PARTICLE BEAM MICROSCOPE, 54: OPTI-

CAL AXIS OF CHARGED PARTICLE BEAM, 56: CONTACT PREVENTING MEMBER, 60: INTRODUCTION PORT, 61: NEEDLE VALVE, 62: ORIFICE, 63: NEEDLE VALVE, 64: VALVE, 100: VACUUM PIPE, 101: GAS CONTROL VALVE, 102: LINKING PORTION, 103: VACUUM PUMP, 104: PRESSURE ADJUSTING VALVE, 107: SUPPORT PLATE, 108, 109: OPERATION KNOB, 121: SECOND HOUSING, 122: LID MEMBER, 123, 124, 126: VACUUM SEALING MEMBER, 131: MAIN BODY PORTION, 132: MATCHING PART, 154: SIGNAL AMPLIFIER, 155: FIXING MEMBER, 159: DIAPHRAGM HOLDING MEMBER, 401: POSITIONING STRUCTURE, 402: OPTICAL MICROSCOPE, 406: OPTICAL MICROSCOPE POSITION DRIVING MECHANISM PORTION, 407: BASE, 408: FOCAL POSITION, 412: OBJECTIVE LENS, 500: LIQUID DROPLET, 500*a*: LIQUID UNDER COVER, 501: COVER, 501*a*: COVER HOLE PORTION, 501*b*: COVER MAIN BODY PORTION, 502: FILTER PAPER, 503: SEALING MEMBER, 504: SEALING MEMBER, 505: CONTACT PORTION BETWEEN COVER AND SAMPLE, 506: SAMPLE TABLE, 507: BENDING PORTION, 508: COVER HOLDING MEMBER

The invention claimed is:

1. An observation support device for observation by irradiating a sample disposed in a non-vacuum space separated by a diaphragm from an inner space of a charged particle optical lens barrel that generates a charged particle beam, with the charged particle beam, comprising:
a cover comprising a main body portion which defines a hole portion that forms an observation region where the sample is observed,
wherein the observation support device is disposed directly between the sample and the diaphragm and is mounted on the sample.

2. The observation support device according to claim 1, wherein the observation support device holds the diaphragm and the sample in a non-contact state.

3. The observation support device according to claim 1, wherein a size of the hole portion is equal to or larger than a size of a window portion which is a part through which the charged particle beam transmits in the diaphragm.

4. The observation support device according to claim 1, wherein a size of the main body portion is larger than a size of a diaphragm holding member which holds the diaphragm.

5. The observation support device according to claim 1, wherein the hole portion is smaller than a size of the diaphragm holding member which holds the diaphragm.

6. The observation support device according to claim 1, wherein a thickness of a periphery of the hole portion of the main body portion is constant.

7. The observation support device according to claim 1, wherein a thickness of a periphery of the hole portion of the main body portion is smaller than a mean free pass depth of the charged particle beam under the observation condition by the charged particle beam.

8. The observation support device according to claim 1, wherein an outer circumferential portion of the observation support device is thicker or harder than a periphery of the hole portion of the main body portion.

9. The observation support device according to claim 1, further comprising:
a seal which defines and seals a space between the main body portion and a sample table on which the sample is mounted.

10. The observation support device according to claim 9, wherein the space between the main body portion and the sample table on which the sample is mounted, which is sealed by the sealing member, communicates with an outside of the space by a hole having an area is smaller than an area of the hole portion.

11. The observation support device according to claim 1, wherein at least a part of the main body portion comprises a material different from a material of a main component of the sample.

12. A sample observation method for observation by irradiating a sample disposed in a non-vacuum space separated by a diaphragm from an inner space of a charged particle optical lens barrel that generates a charged particle beam, with the charged particle beam, the method comprising:
directly loading an observation support device on the sample, the observation support device comprising a cover having a main body portion which defines a hole portion that forms an observation region where the sample is observed; and
bringing the sample on which the observation support device is loaded close to the diaphragm.

13. The sample observation method according to claim 12,
wherein the diaphragm and the sample are held in a non-contact state.

14. The sample observation method according to claim 12, further comprising:
positioning the hole portion of the observation support device at a part to be observed on the sample.

15. The sample observation method according to claim 12, further comprising:
disposing the hole portion immediately below the diaphragm, by identifying a difference in brightness in charged particle microscope images of the sample portion and the main body portion which are exposed from the hole portion, and by moving a sample stage on which the sample is mounted.

16. The sample observation method according to claim 12,
further comprising sealing a space between the main body portion and a sample table on which the sample is mounted.

17. The sample observation method according to claim 12,
further comprising removing liquid droplets which exist on a surface of the sample on which the observation support device is loaded and which is exposed to the hole portion.

18. The sample observation method according to claim 17,
wherein said removing the liquid droplets which exist on the surface of the sample exposed to the hole portion further comprises evacuating the space where the sample on which the observation support device is mounted.

19. A charged particle beam apparatus comprising:
a diaphragm separating an inner space of a charged particle optical lens barrel that generates a charged particle beam, and a space in which a sample is disposed, the diaphragm allowing the charged particle beam to transmit or pass through the diaphragm;
a sample table on which the sample is mounted; and an observation support device comprising a main body portion for partially covering the sample and which defines a hole portion that forms an observation region where the sample is observed, wherein liquid is retained between the sample table and the main body portion.

20. The charged particle beam apparatus according to claim 19, wherein the hole portion is smaller than a size of a diaphragm holding member which holds the diaphragm, a thickness of a periphery of the hole portion of the main body portion is smaller than a mean free pass depth of the charged particle beam under the observation condition by the charged particle beam, and an outer circumferential portion of the observation support device is thicker or harder than the periphery of the hole portion of the main body portion.

21. The charged particle beam apparatus according to claim 20, further comprising:

a sealing member which seals a space between the main body portion and the sample table, wherein the space between the main body portion and the sample table, which is sealed by the sealing member, communicates with an outside of the space by a hole having an area smaller than an area of the hole portion.

* * * * *